United States Patent [19]

Kanamori

[11] Patent Number: 5,592,002
[45] Date of Patent: Jan. 7, 1997

[54] NON-VOLATILE SEMICONDUCTOR MEMORY DEVICE HAVING REDUCED CURRENT CONSUMPTION

[75] Inventor: Kohji Kanamori, Tokyo, Japan

[73] Assignee: NEC Corporation, Tokyo, Japan

[21] Appl. No.: 534,858

[22] Filed: Sep. 27, 1995

[30] Foreign Application Priority Data

Sep. 29, 1994 [JP] Japan .................................. 6-259094

[51] Int. Cl.$^6$ .................................................. H01L 29/68
[52] U.S. Cl. ........................ 257/321; 257/316; 257/324
[58] Field of Search ...................................... 257/315, 316, 257/321, 324, 326

[56] References Cited

U.S. PATENT DOCUMENTS

| | | | |
|---|---|---|---|
| 4,750,024 | 6/1988 | Schreck | 257/321 |
| 5,095,344 | 3/1992 | Harari | 257/321 |
| 5,130,769 | 7/1992 | Kuo et al. | 257/316 |
| 5,192,872 | 3/1993 | Lee | 257/316 |
| 5,274,588 | 12/1993 | Manzor et al. | 257/316 |
| 5,317,179 | 5/1994 | Chen et al. | 257/316 |

FOREIGN PATENT DOCUMENTS

| | | |
|---|---|---|
| 60-161673 | 8/1985 | Japan . |
| 62-271474 | 11/1987 | Japan . |
| 2-118997 | 5/1990 | Japan . |

OTHER PUBLICATIONS

Gheorghe Samachisa et al, "A 128K Flash EEPROM Using Double–Polysilicon Technology", *IEEE J. Solid–State Circuits*, vol. SC–22, No. 5, pp. 176–182. No date.

*Primary Examiner*—Sara W. Crane
*Assistant Examiner*—David B. Hardy
*Attorney, Agent, or Firm*—Sughrue, Mion, Zinn, Macpeak & Seas

[57] ABSTRACT

In a non-volatile semiconductor memory device, an n-type impurity diffusion layer constituting source and drain regions is formed on the surface area of a p-type silicon substrate, and then a first oxide film is formed on the n-type impurity diffusion layer. A floating gate is formed on the silicon substrate so as to be partially overlapped with the drain region through a second oxide film, and a control gate is formed thereon through a third oxide film and an insulating film. The thickness of the third oxide film is set to a value larger than the total thickness of the second oxide film and the insulating film to prevent occurrence of F-N tunnel action in a split gate region.

13 Claims, 5 Drawing Sheets

NON-VOLATILE SEMICONDUCTOR MEMORY DEVICE HAVING REDUCED CURRENT CONSUMPTION

BACKGROUND OF THE INVENTION

1. Field of the Invention

The present invention relates to a non-volatile semiconductor memory device, and particularly to a simultaneously-erasable non-volatile semiconductor memory device including memory cells each having a floating gate.

2. Description of Related Art

Recently, semiconductor memories have been developed to be highly integrated, highly densified and highly functionalized, and this development has enabled the semiconductor memories to compete with magnetic discs as memory material.

In a simultaneously (collectively) erasable non-volatile memory device, data erasing is performed by F-N (Fowler-Nordheim) tunnel current, and data writing is performed by hot-electron injection. This type semiconductor memory device has a disadvantage that data are excessively erased. However, a split-gate type non-volatile semiconductor device in which each memory cell has a split gate has an advantage that an excessive erasing state hardly occurs because a split portion serves as a select transistor.

FIG. 1 is a cross-sectional view showing the structure of a memory cell of a conventional split-gate type non-volatile semiconductor memory device which uses F-N tunnel current for erasing. In FIG. 1, reference numeral 201 represents a p-type silicon substrate, reference numeral 205 represents an n-type impurity diffusion layer which constitutes source and drain regions, reference numeral 208 represents a floating gate, reference numeral 213 represents a control gate which also serves as a split gate, reference numeral 207 represents a silicon oxide film which is a gate insulating film, reference numeral 212 represents a silicon oxide film which constitutes an interlayer film between the control gate 213 and the floating gate 208 and the gate insulating film of the split gate portion, and reference numeral 206 represents a silicon oxide film for insulating a buried diffusion layer (205) from the floating gate 208 and the control gate 213. The silicon oxide film 212 of the interlayer film between the control gate 213 and the floating gate 208 and the silicon oxide film 212 of the gate insulating film at the split portion are formed in the same process by a thermal oxidation treatment, and the thickness of the interlayer film between the control gate 213 and the floating gate 208 is set to be larger than that of the gate insulating film because the floating gate 208 exists.

In the conventional non-volatile memory device using F-N tunnel current for erasing as shown in FIG. 1, the data erasing is performed as follows. First, the control gate 213 and the substrate 201 are grounded, and a voltage of 12 V for example, is applied to the n-type impurity diffusion layer 205 at the right side of FIG. 1 which will be the drain region while the impurity region 205 at the left side which will be the source region is kept in an open state. At this time, electrons are discharged from the floating gate 208 to the drain region, and the threshold voltage of the transistor is reduced, so that the memory cell is kept in an data-erased state.

On the other hand, the data writing is performed as follows. A voltage of 12 V for example, is applied to the control gate 213, and 5 V to 8 V is applied to the drain region (n-type impurity diffusion layer 205 at the right side of FIG. 1) while the source region (n-type impurity diffusion layer 205 at the left side of FIG. 1) and the substrate 201 are grounded. At this time, current of about 0.5 to 1 mA flows in the channel region, and hot electrons are produced. Some of the hot electrons are doped into the floating gate 208 to increase the threshold voltage of the memory transistor, whereby the memory cell is kept in a write state.

In the memory transistor shown in FIG. 1, in order to reduce the applied voltages for the writing and erasing operations, the gate oxide film 207 under the floating gate 208 is required to be thinned. The thinning of the gate oxide film 207 enables the reduction of the drain voltage in the erasing operation and the gate voltage of the control gate 213 in the writing operation. In this case, an amount of current flowing into the memory transistor in the writing operation increases or it is unvaried.

This type of split-gate type non-volatile semiconductor memory device has been publicly known by Japanese Laid-open Patent Application No. Sho-62-271474, Japanese Laid-open Patent Application No. Hei-2-118997, etc. In addition, Japanese Laid-open Patent Application No. Sho-60-161673 discloses a semiconductor memory device having a different type memory cell, and it describes that both the erasing and writing operations are performed by tunnel current.

In the conventional split-gate type non-volatile semiconductor device as described above, the current consumption for the writing operation is large because the writing is performed by the hot electron injection. Furthermore, if the gate oxide film is thinned, the voltage to be applied to the control gate, etc. can be reduced, however, the current consumption is little varied. In addition, when large current is required, it is almost impossible to cover the current consumption with a booster circuit which is provided in an integration circuit. Therefore, it has been difficult for the conventional semiconductor memory device to achieve a single low-voltage power source of 5 V or less, for example, 3 V.

In view of the foregoing, it may be considered for reduction of the current consumption that the F-N tunnel current is enabled to be used for both the writing and erasing operations by applying the writing and erasing method as disclosed in Japanese Laid-open Patent Application No. Sho-60-161673 to the conventional non-volatile semiconductor memory device shown in FIG. 1. However, in this case, it is necessary to apply a high voltage to the control gate in the writing operation. At this time, the F-N tunnel current flows between the split gate (control gate) and the substrate because the thickness of the oxide film between the split gate and the substrate is not so large. Therefore, the oxide film on the split gate region is deteriorated, and the threshold voltage of the split gate region is varied by electrons injected into the oxide film, so that the operation of the memory transistor becomes unstable.

If the gate insulating film of the split gate portion is made thicker, the F-N tunnel current can be prevented from flowing between the control gate and the substrate. However, in the conventional memory cell as described above, the gate oxide film of the split gate portion and the oxide film between the floating gate and the control gate are formed in the same thermal oxidation process, so that the insulating film between the control gate and the floating gate is also made to have a large thickness. Therefore, controllability of the floating gate by the control gate is degraded, and thus an electron injection/discharge efficiency in the writing/erasing operation is also reduced. Alternatively, the voltage to be applied to the control gate in the writing and erasing operations must be further increased.

3

SUMMARY OF THE INVENTION

An object of the present invention is to provide a (split-gate type) non-volatile semiconductor memory device in which F-N tunnel current can be used for both writing and erasing operations to achieve a single low-voltage power source, and deterioration of transistor characteristics and degradation of controllability of a control gate can be prevented.

In order to attain the above object, according to one aspect of the present invention, there is provided a non-volatile semiconductor memory device in which a second conduction type source region and a drain region are formed in a first conduction type semiconductor substrate or in a surface area of the first conduction type semiconductor substrate, a first insulating film, a floating gate, a second insulating film and a control gate are laminated in this order on a first channel region which is located between the source and drain regions and nearer to the drain region, a third insulating film and a split gate are formed in this order on a second channel which is located between the source and drain regions and nearer to the source region, and the control gate and the split gate are electrically connected to each other, and in which the first insulating film has the smallest thickness and the third insulating film has the largest thickness in the first, second and third insulating films.

According to other aspect of the present invention, there is provided a method of manufacturing a non-volatile semiconductor memory device which comprises the following steps:

(a) a step of selectively forming an oxidation-proof film on a first conduction type semiconductor substrate or a device region which is set on the first conduction type semiconductor substrate, (b) a step of doping second conduction type impurities using the oxidation-proof film as a mask to form a second conduction type diffusion layer constituting a source region and a drain region, (c) a step of performing thermal oxidation using the oxidation-proof film as a mask to form a relatively thick fourth insulating film on the second conduction type diffusion layer, (d) a step of removing the oxidation-proof film and forming a first insulating film on the oxidation-proof film removed area by thermal oxidation, (e) a step of forming a first conduction layer on the first insulating film and forming on the first conduction layer a second insulating film which contains a silicon nitride film and is thicker than the second insulating film, (f) a step of patterning the second insulating film and the first conduction layer to form a floating gate material layer extending from the upper portion of an intermediate portion of a channel region to the upper portion of the drain region with the first conduction layer, (g) a step of performing thermal oxidation using the second insulating film as a mask to form a third insulating film having a thickness larger than the second insulating film on the channel region which is nearer to the source region, and (h) a step of forming a second conduction layer on the whole surface and patterning the second conduction layer and the floating gate material layer in the same pattern to form a floating gate and a control gate which also serves as a split gate.

According to the present invention, the first gate insulating film under the floating gate, the second insulating film between the floating gate and the control gate and the third gate insulating film of the split gate portion are designed to be thicker in this order. With this construction, the electron injection into the floating gate and the electron discharge from the floating gate by F-N tunnel current can be performed in both the writing and erasing operations by applying a suitable voltage to each portion. In this case, even when a high voltage is applied to the control gate at the time of the electron injection into the floating gate for the erasing, electron tunneling into the control gate at the split gate portion can be prevented. Furthermore, the inter-gate insulating film (the insulating film between the control gate and the floating gate) is designed not to be excessively thick, so that reduction of a coupled capacity ratio based on the control gate can be prevented, and thus high controllability of the control gate can be kept.

According to the present invention, both the writing and erasing operations can be performed by the F-N tunnel current without deteriorating the transistor characteristics and reducing the electron injection/discharge efficiency. In addition, the current consumption per cell is equal to about 1 pA to 10 pA at the time of the electron injection based on the F-N tunnelling action (at the erasing time), and this value is still lower as compared with a case where hot electrons are used. Accordingly, the writing and erasing operations can be performed by current supply from a booster circuit provided in a chip, and thus the memory device can operate with a single low-voltage power source below 5 V.

DETAILED DESCRIPTION OF THE PREFERRED EMBODIMENTS

Preferred embodiments according to the present invention will be described hereunder with reference to the accompanying drawings.

[First Embodiment]

Figure 1:
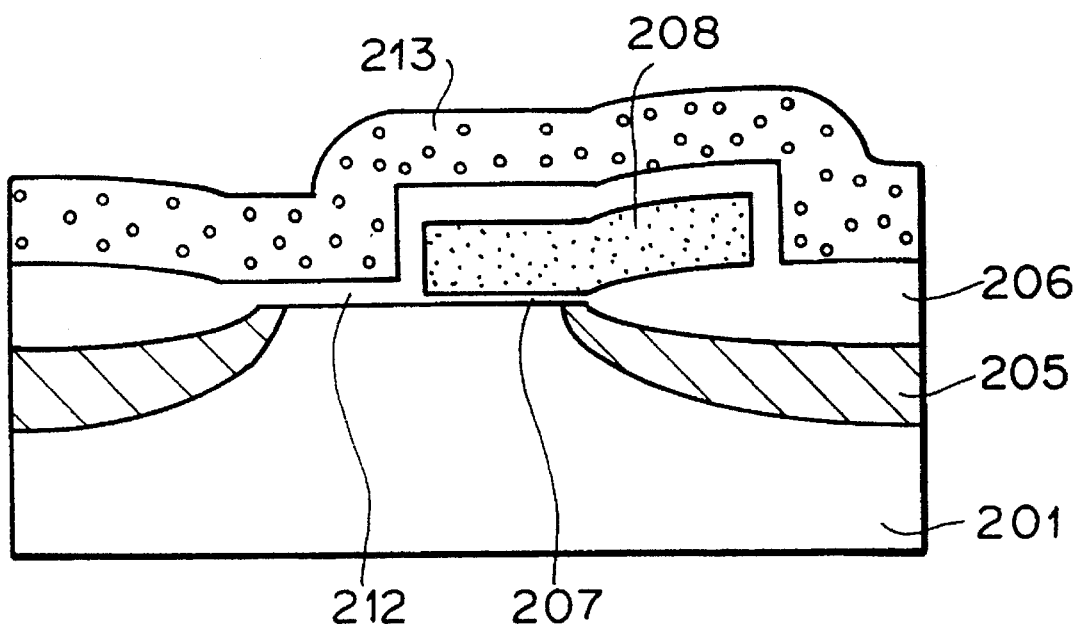
FIG. 1 is a cross-sectional view showing a conventional memory cell.
Figure 2:
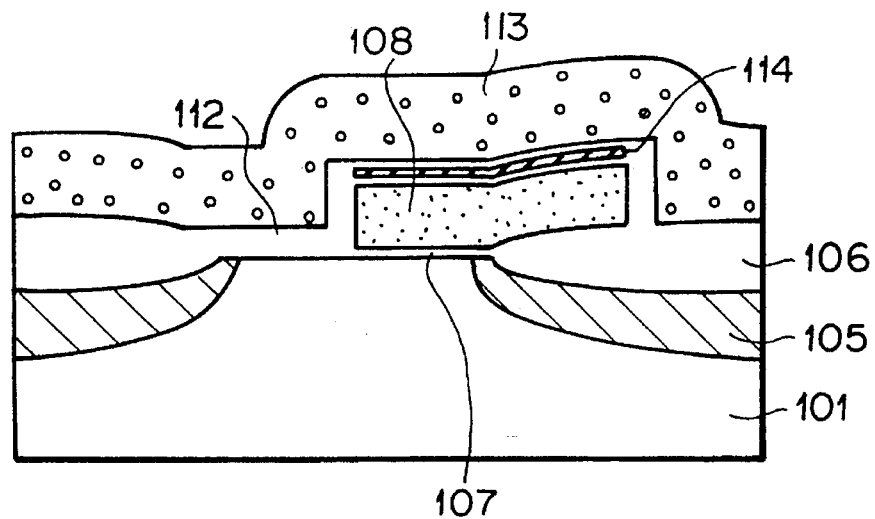
FIG. 2 is a cross-sectional view showing a memory cell (non-volatile semiconductor memory device) according to a first embodiment of the present invention.
Figure 3:
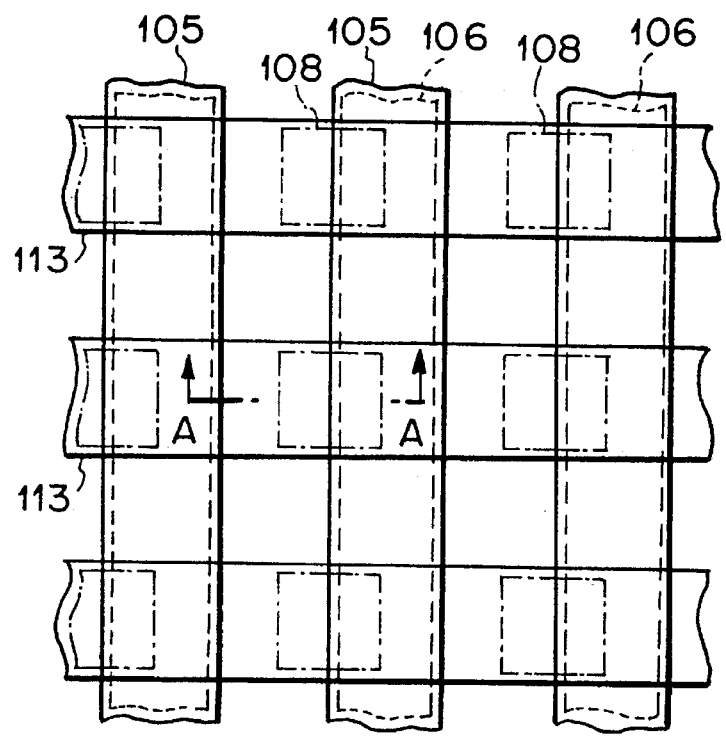
FIG. 3 is a plan view showing a memory cell array unit of the first embodiment according to the present invention.

FIG. 2 is a cross-sectional view showing the construction of a memory cell of a first embodiment according to the present invention, which is taken along a line A—A line of FIG. 3, and FIG. 3 is a plan view which schematically shows a memory cell array unit of FIG. 2.

In FIGS. 2 and 3, reference numeral 101 represents a p-type silicon substrate, reference numeral 105 represents an n-type impurity diffusion layer, reference numeral 106 represents a silicon oxide film which is formed by oxidizing the surface of the silicon substrate 101, reference numeral 108 represents a floating gate, reference numeral 113 represents a control gate which also serves as a split gate, reference numeral 107 represents a silicon oxide film which is formed between the floating gate 108 and the substrate 101 and serves as a tunnelling insulating film, reference numeral 112 represents a silicon oxide film which constitutes a gate insulating film in the split gate area, and reference numeral 114 represents an inter-gate insulating film which is formed between the control gate 113 and the floating gate 108 and designed in an ONO (oxide-nitride-oxide) structure.

As shown in FIG. 3, the n-type impurity diffusion layer 105 is also used as a bit line, and the control gate 113 is also used as a word line.

In the above embodiment, the p-type silicon substrate is used as the substrate, and a memory cell is formed on the p-type silicon substrate. However, the memory cell may be formed in a p-well which is formed on a p-type or n-type substrate.

Next, the operation of the non-volatile semiconductor memory device according to the embodiment will be described. In this embodiment, a writing state is set to a low threshold voltage state (electron discharge state), and an erasing state is set to a high threshold voltage state (electron injection state).

A data writing operation is performed as follows. That is, −8 V for example is applied to the control gate 113, 5 V is applied to a drain region (n-type impurity diffusion layer 105 at the right side in FIG. 2), a source region (n-type impurity diffusion layer 105 at the left side in FIG. 2) is kept in an open state, and the substrate is grounded. In this case, electrons are drawn out from the floating gate 108 to the drain 105 by the F-N tunnelling action, so that the threshold voltage of the memory transistor is reduced.

A data erasing operation is performed as follows. That is, a high voltage of 16 V for example is applied to the control gate 113, and all of the drain, the source and the substrate are grounded. Electrons are injected from the substrate 101 or the drain 105 into the floating gate 108 by the F-N tunnelling action. In this case, no F-N tunnelling current flows into the split gate 113 unlike the prior art because the oxide film of the split gate portion 113 has a sufficient thickness. Accordingly, there occurs no deterioration of the oxide film of the split gate area 113 due to application of the high voltage to the control gate. In addition, there is no possibility that the device operates unstably.

Furthermore, a data reading operation is performed as follows. That is, 3 to 5 V for example is applied to the control gate 113, about 1 V is applied to the drain 105, the source 105 and the substrate 101 are kept to the ground potential, and presence of drain current is detected to perform the data reading.

According to the non-volatile semiconductor memory device of the present invention, the thickness of the oxide film of the split gate area 113 is set to such a value that no F-N tunnelling action occurs, without varying the thickness of the inter-gate insulating film 114 between the floating gate 108 and the control gate layer 113, that is, without reducing the coupling capacity ratio. Accordingly, the electron injection (the erasing in this invention) can be performed with low current consumption without sacrificing the controllability of the control gate 113, and thus the operation of the non-volatile semiconductor memory device of this invention can be performed with a single low-voltage power source.

Furthermore, according to the non-volatile semiconductor memory device of the present invention, the thickness of the silicon oxide film 112 is set to be larger than the total film thickness of the silicon oxide film 107 and the inter-gate insulating film 114. This is because no F-N tunnel current would flow in the silicon oxide film 112 if the density of electric field applied to each insulating film at the erasing or writing time is set as to be smallest at the silicon oxide film 112.

Next, a method of manufacturing the above-mentioned non-volatile semiconductor memory device according to a first embodiment of the present invention will be described with reference to FIGS. 4A to 4D and FIGS. 5A to 5D.

FIGS. 4A to 4D and FIGS. 5A to 5D are cross-sectional views showing a series of processes to manufacture the non-volatile semiconductor memory device as described above.

Figure 4A:
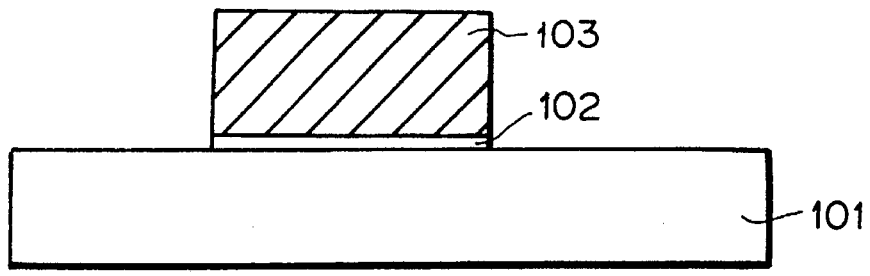
FIGS. 4A to 4D are cross-sectional views showing a series of processes of a manufacturing method of the first embodiment according to the present invention.

As shown in FIG. 4A, a element separation region (not shown) is first formed on the surface of a p-type silicon substrate 101, and then a silicon oxide film 102 is formed on the element region by a thermal oxidation method, for example. Thereafter, a silicon nitride film 103 is grown at a thickness of about 300 nm by a CVD (Chemical Vapor Deposition) method, and then a photolithographic technique and a dry etching method is applied to perform a patterning treatment so that a pattern on a channel region remains.

Figure 4B:
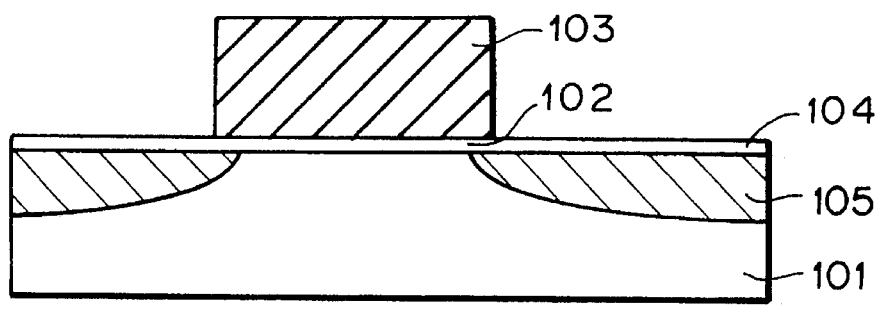

Subsequently, as shown in FIG. 4B, a silicon oxide film 104 is formed by the thermal oxidation method, and then n-type impurities, for example, arsenic(As) is doped into the substrate by the ion-implantation method using the silicon nitride film 103 as a mask at energy of 70 keV and dose amount of $5 \times 10^{15}$ cm$^{-2}$. Thereafter, the n-type impurities are diffused in the substrate at for example 900° C. under $N_2$ atmosphere to form an n-type impurity diffusion layer 105 which will be source and drain regions.

Figure 4C:
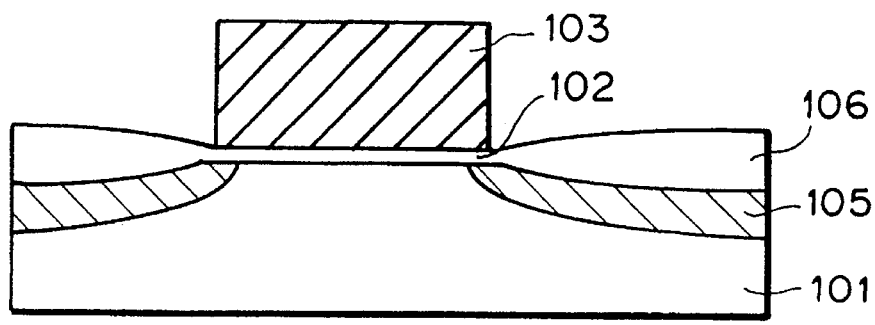

Subsequently, as shown in FIG. 4C, the thermal oxidation is performed using the silicon nitride film 103 as a mask to form a silicon oxide film 106 of about 100 nm thickness on the n-type impurity diffusion layer 105.

Figure 4D:
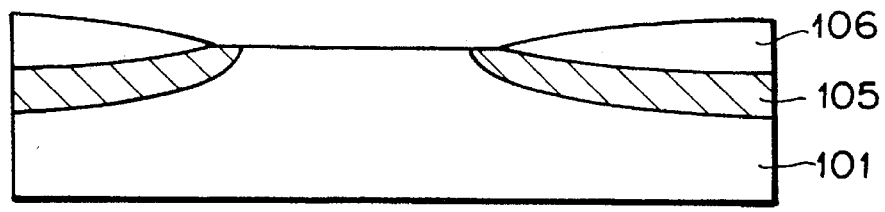

Thereafter, as shown in FIG. 4D, the silicon nitride film 103 and the silicon oxide film 102 are removed by a wet etching method to expose the surface of the silicon substrate at the channel region to the outside.

Figure 5A:
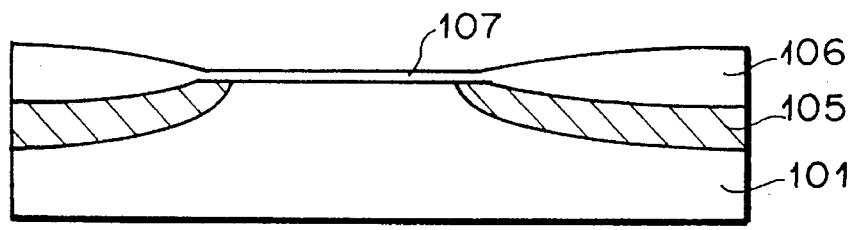
FIGS. 5A to 5D are cross-sectional views showing a series of processes which are subsequent to the processes shown in FIGS. 4A to 4D.

Subsequently, as shown in FIG. 5A, a silicon oxide film 107 is formed as a tunnel oxide film, for example, at a thickness of 8 nm by the thermal oxidation method. The thickness of the silicon oxide film 107 is set to 11 nm or less. If the thickness is larger than 11 nm, the control voltage must be set to a large value. For example, the control voltage is set to about 12 V, the thickness of the silicon oxide film 107 is preferably set to 8 nm. The thermal oxidation may be performed by using an RTO (Rapid Thermal Oxidation) method in place of an ordinary thermal oxidation method. Furthermore, in order to improve reliability of the tunnel oxide film, the oxidation is performed by the RTO method under an atmosphere containing not only oxygen, but also $N_2O$ or $NH_3$ to form a silicon nitrated oxide film.

Figure 5B:
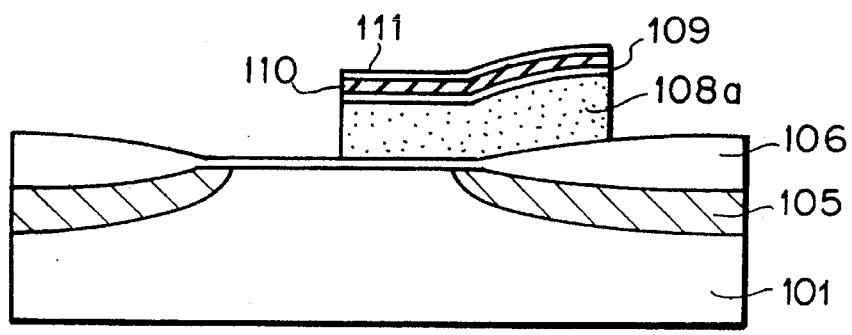

Subsequently, as shown in FIG. 5B, a polysilicon film 108a into which arsenic(As) or phosphorus is diffused is grown at a thickness of 150 nm by the CVD method, and a silicon oxide film 109 is formed at a thickness of 6 nm on the polysilicon film 108a by an HTO (High Temperature CVD oxide) method, for example. Subsequently, a silicon nitride film 110 is grown at a thickness of 8 nm on the silicon oxide film 109 by the CVD method, and then a silicon oxide film 111 is grown at a thickness of 5 nm on the silicon nitride film 110 by the HTO method. Thereafter, a patterning treatment is performed using a photolithographic technique and an RIE (Reactive Ion Etching) method to form a floating gate 108a extending from the center of the channel region to the drain side. In this process, the split gate region is also formed from the channel center to the source region.

Figure 5C:
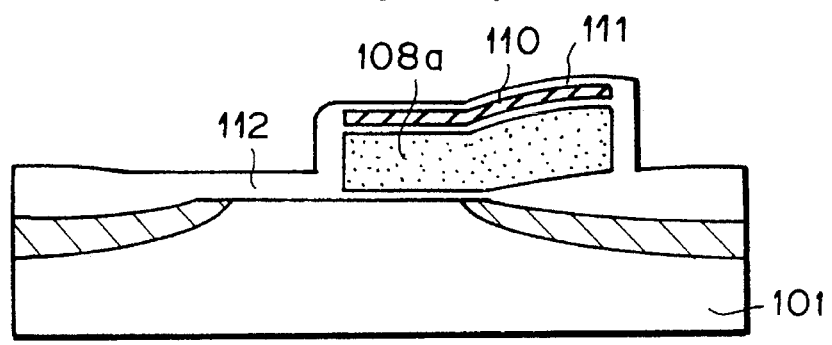

Subsequently, as shown in FIG. 5C, the thermal oxidation is performed using the silicon oxide film 111 and the silicon nitride film 110 as a mask to grow a silicon oxide film 112 at a thickness of 30 nm in the split gate region and on the side walls of the polysilicon film 108a.

Figure 5D:
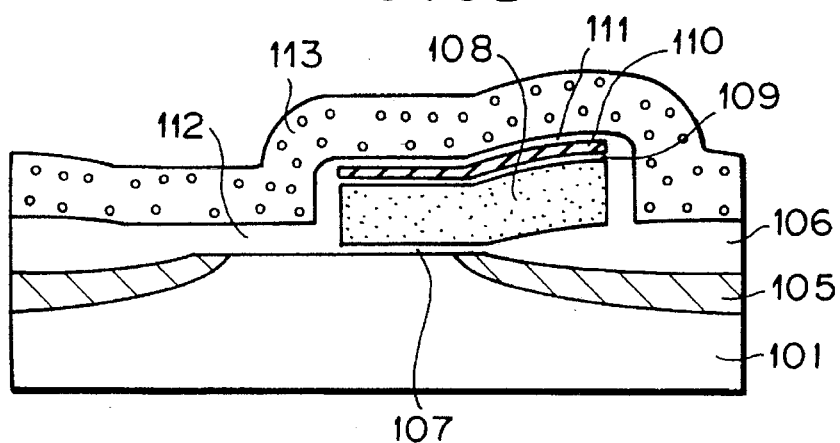

Subsequently, as shown in FIG. 5D, a polysilicon film into which As or phosphorus is diffused is grown at a thickness of 250 nm by the CVD method, and the polysilicon film 113, the silicon oxide film 111, the silicon nitride film 110, the silicon oxide film 109 and the polysilicon film 108a are subjected to the patterning treatment using the photolithographic technique and the RIE method, and then subjected to the etching treatment to form a control gate 113 and a floating gate 108 as shown in FIG. 3, for example.

The control gate 113 may be formed of a polycide film in place of polysilicon.

[Second Embodiment]

Next, a second embodiment according to the present invention will be described with reference to FIG. 6. FIGS. 6A to 6D are cross-sectional views showing a series of processes of a manufacturing method according to the second embodiment. In this embodiment, the same processes as the first embodiment are A performed until the silicon nitride film 110 is grown as shown in FIG. 5B, and thus the other processes subsequent to the process of growing the silicon nitride film 110 will be described in the following description.

Figure 6A:
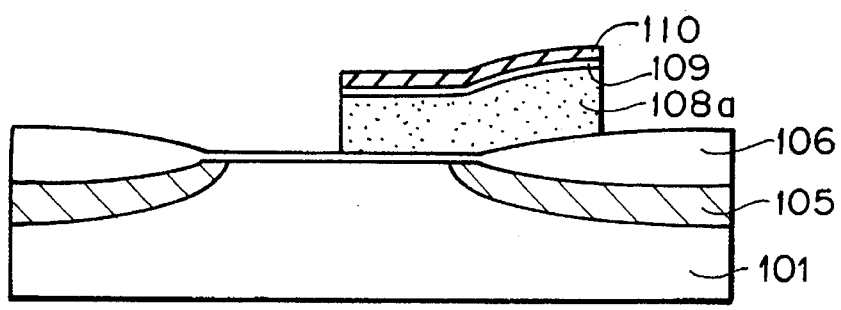
FIGS. 6A to 6D are cross-sectional views showing a series of processes of a manufacturing method of a second embodiment according to the present invention.

As shown in FIG. 6A, after the silicon nitride film 110 is grown at a thickness of about 8 nm on the silicon oxide film 109, the silicon nitride film 110, the silicon oxide film 109 and the polysilicon film 108a are subjected to the patterning treatment so that the floating gate 108a is formed from the channel center to the drain side. In this process, the split gate region is also formed from the channel center to the source region.

Figure 6B:
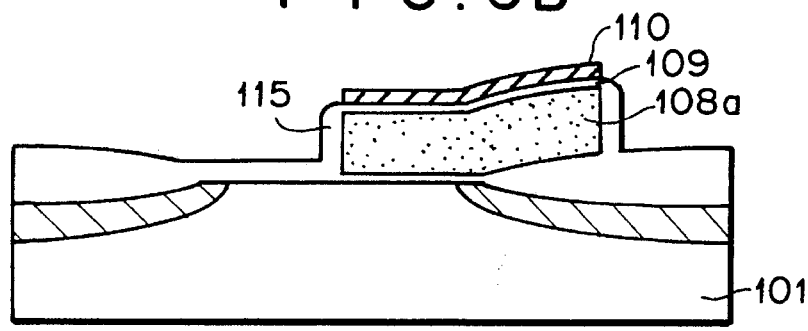

Subsequently, as shown in FIG. 6B, the thermal oxidation is performed using the silicon nitride film 110 as a mask to form a silicon oxide film 115 at a thickness of about 25 nm in the split gate region and on the side walls of the polysilicon film 108a.

Figure 6C:
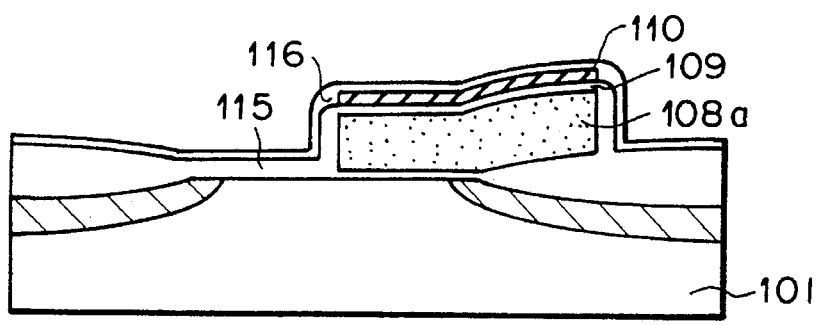
Figure 6D:
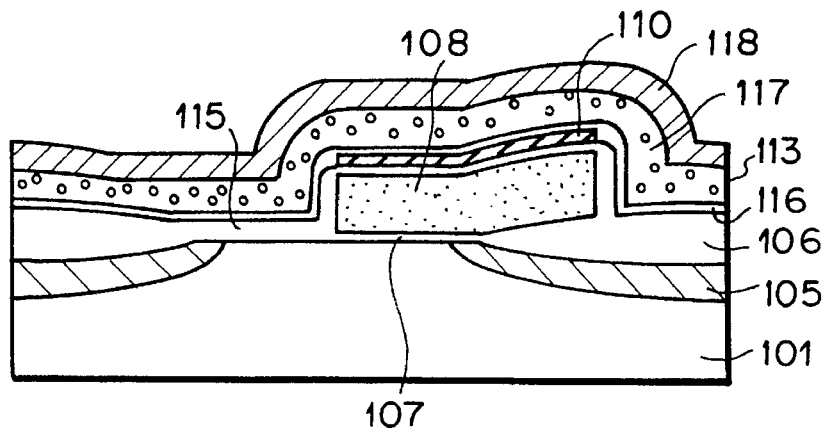

Subsequently, as shown in FIG. 6C, a silicon oxide film 116 is formed on the silicon oxide film 115 and the silicon nitride film 110 at a thickness of 5 nm by the HTO method, for example. Thereafter, as shown in FIG. 6D, a polysilicon film 117 is grown at a thickness of 150 nm by the CVD method, and then titanic silicide is formed on the polysilicon film 117 at a thickness of 100 nm by a sputtering method to form a polycide film 118 with which the control gate will be formed. Subsequently, the polycide film 118, the polysilicon film 117 under the polycide film 118, the silicon oxide film 116, the silicon nitride film 110, the silicon oxide film 109 and the polysilicon film 108a are subjected to the patterning treatment, and then etched to form the control gate 113 and the floating gate 108.

As described above, in the non-volatile semiconductor memory device (split-gate type memory cell) according to the present invention, the gate oxide film for the floating gate is designed to have such a thickness that F-N tunnelling action is permitted, and the gate oxide film of the split gate portion is designed to have such a thickness that no F-N tunnelling action occurs. Furthermore, the inter-gate insulating film between the control gate and the floating gate is designed to have such a thickness that the controllability of the control gate is not reduced. Therefore, the oxide film of the split gate portion can be prevented from being deteriorated, and both the writing and erasing operations can be stably performed with F-N tunnel current. Accordingly, the present invention has an advantage that the current consumption for electron injection can be remarkably suppressed, and the single low-voltage power source can be achieved.

While this invention has been particularly shown and described with reference to the preferred embodiment thereof, it will be understood that various changes in form and details may be made therein without departing from the spirit and scope of the invention.

What is claimed is:

1. A non-volatile semiconductor memory device comprising:

a semiconductor substrate of a first conduction type;

a source region and a drain region of a second conduction type formed in said semiconductor substrate and separated by first and second channel regions, said first channel being adjacent to said drain region and said second channel region being adjacent to said source region;

a first insulating film formed over said first channel region;

a floating gate formed over said first insulating film;

a second insulating film formed over said floating gate;

a control gate formed over said second insulating film;

a third insulating film formed over said second channel region;

a split gate, electrically connected to said control gate, formed over said third insulating film;

wherein relative thickness of said insulating films is ordered so that the thickness of said first insulating film is the smallest, the thickness of said third insulating film is the largest, and the thickness of said second insulating film is greater than the thickness of said first insulating film and less than the thickness of said third insulating film; and wherein said non-volatile semiconductor memory performs a data writing operation such that electrons are drawn out from said floating gate to said drain region by a Fowler-Nordheim tunnelling action.

2. The non-volatile semiconductor memory device as claimed in claim 1, wherein the thickness of said third insulating film is set to be larger than the total thickness of said first and second insulating films.

3. The non-volatile semiconductor memory device as claimed in claim 1, wherein said source and drain regions are buried under a relatively thick fourth insulating film, except for respective parts of said source and drain regions which are near to a channel region, and said floating gate is overlapped with said drain region through said fourth insulating film.

4. The non-volatile semiconductor memory device as claimed in claim 1, wherein said second insulating film is designed in a laminate structure containing a silicon oxide film, a silicon nitride film and a silicon oxide film.

5. The non-volatile semiconductor memory device as claimed in claim 1, wherein said control gate is formed integrally and continuously with said split gate so as to extend over said source and drain regions to the semiconductor substrate.

6. The non-volatile semiconductor memory device as claimed in claim 1, wherein the minimum thickness of said first insulating film is set to such a value that Fowler-Nordheim tunnel current is permitted to flow and the maximum thickness thereof is set to 11 nm.

7. The non-volatile semiconductor memory device as claimed in claim 1, wherein the thickness of said first insulating film is in the range of 8 nm and 11 nm, the thickness of said second insulting film is in the range of 11 nm and 19 nm, and the thickness of said third insulating film is greater than 19 nm.

8. The non-volatile semiconductor memory device as claimed in claim 1, wherein said first, second, and third insulating films' thicknesses are of such values that Fowler-Nordheim tunnel current flows through said first insulating film but not through said second insulting film and said third insulating film during a data writing and a data erasing of said non-volatile semiconductor memory device.

9. The non-volatile semiconductor memory device as claimed in claim 1, whereby said first, second, and third insulating films' thicknesses are set to such values that Fowler-Nordheim tunnel current can be used for both data writing and data erasing, and current consumption is reduced.

10. The non-volatile semiconductor memory device as claimed in claim 1, further comprising a means for writing and erasing said non-volatile semiconductor memory device using Fowler-Nordheim tunnel current, thereby reducing the current consumption of said non-volatile semiconductor memory device.

11. The non-volatile semiconductor memory device as claimed in claim 1, wherein said non-volatile semiconductor memory performs a data erasing operation such that electrons are injected from said drain region into said floating gate by said Fowler-Nordheim tunneling action.

12. A non-volatile semiconductor memory device comprising:

a semiconductor substrate of a first conduction type;

a source region and a drain region of a second conduction type formed in said semiconductor substrate and separated by first and second channel regions, said first channel being adjacent to said drain region and said second channel region being adjacent to said source region;

a first insulating film formed over said first channel region;

a floating gate formed over said first insulating film;

a second insulating film formed over said floating gate;

a control gate formed over said second insulating film;

a third insulating film formed over said second channel region;

a split gate, electrically connected to said control gate, formed over said third insulating film;

a means for reducing current consumption during data writing and data erasing, said writing and erasing using Fowler-Nordheim tunnel current which passes through only said first insulating film; and wherein said non-volatile semiconductor memory performs said data writing operation such that electrons are drawn out from said floating gate to said drain region by a Fowler-Nordheim tunnelling action.

13. The non-volatile semiconductor memory device as claimed in claim 12, further comprising a means for writing and erasing said non-volatile semiconductor memory device using Fowler-Nordheim tunnel current, thereby reducing the current consumption of said non-volatile semiconductor memory device.

\* \* \* \* \*